(12) United States Patent
Yazawa et al.

(10) Patent No.: US 6,856,037 B2
(45) Date of Patent: Feb. 15, 2005

(54) METHOD AND APPARATUS FOR CONVERTING DISSIPATED HEAT TO WORK ENERGY

(75) Inventors: Kazuaki Yazawa, Chiba (JP); Avram Bar-Cohen, 1440 Utah Ave. S., St. Louis Park, MN (US) 55426

(73) Assignees: Sony Corporation, Tokyo (JP); Avram Bar-Cohen, College Park, MD (US)

( * ) Notice: Subject to any disclaimer, the term of this patent is extended or adjusted under 35 U.S.C. 154(b) by 0 days.

(21) Appl. No.: 09/994,179

(22) Filed: Nov. 26, 2001

(65) Prior Publication Data

US 2003/0098588 A1 May 29, 2003

(51) Int. Cl.[7] .......................... F03B 13/00; H05K 7/20; G06F 1/16; F28D 15/02
(52) U.S. Cl. ............................... 290/43; 290/2; 290/7; 361/687; 361/699; 361/700
(58) Field of Search ........................ 290/43, 7, 2, 42; 361/687, 695–704

(56) References Cited

U.S. PATENT DOCUMENTS

| | | | | |
|---|---|---|---|---|
| 3,609,991 A | * | 10/1971 | Chu et al. ................... 62/333 |
| 3,675,031 A | * | 7/1972 | Lavigne ...................... 290/1 R |
| 3,929,305 A | * | 12/1975 | Sabol ........................ 244/117 A |
| 3,995,160 A | * | 11/1976 | Zener et al. ................. 290/1 R |
| 4,135,364 A | * | 1/1979 | Busick ......................... 60/325 |
| 4,142,108 A | * | 2/1979 | Matthews .................... 290/1 R |
| 4,204,246 A | * | 5/1980 | Arii et al. ................... 361/699 |
| 4,212,593 A | * | 7/1980 | Chadwick .................... 417/53 |
| 4,326,132 A | * | 4/1982 | Bokel ........................ 290/1 R |
| 4,366,526 A | * | 12/1982 | Lijoi et al. .................. 361/700 |
| 4,366,857 A | * | 1/1983 | Mayer .................. 165/104.23 |
| 4,392,062 A | * | 7/1983 | Bervig ......................... 290/54 |
| 4,433,248 A | * | 2/1984 | Marks .......................... 290/44 |
| 4,449,576 A | * | 5/1984 | Baum et al. ........... 165/104.33 |
| 4,503,483 A | * | 3/1985 | Basiulis ....................... 361/700 |
| 4,513,346 A | * | 4/1985 | Devins ........................ 361/212 |
| 4,625,790 A | * | 12/1986 | Okayasu ................ 165/104.22 |
| 4,712,612 A | * | 12/1987 | Okamoto et al. ............ 165/146 |
| 4,767,938 A | * | 8/1988 | Bervig ......................... 290/54 |
| 4,793,405 A | * | 12/1988 | Diggelmann et al. .. 165/104.33 |
| 4,833,567 A | * | 5/1989 | Saaski et al. ................ 361/700 |
| 4,845,376 A | * | 7/1989 | Bendiks ....................... 290/54 |
| 4,851,722 A | * | 7/1989 | Zauderer ..................... 310/11 |
| 4,881,593 A | * | 11/1989 | Okayasu ................ 165/104.29 |
| 4,930,570 A | * | 6/1990 | Okayasu ................ 165/104.14 |
| 4,931,905 A | * | 6/1990 | Cirrito et al. ............... 361/700 |
| 4,941,530 A | * | 7/1990 | Crowe ................... 165/104.33 |
| 4,949,164 A | * | 8/1990 | Ohashi et al. ............... 257/715 |
| 5,004,973 A | * | 4/1991 | Taraci et al. ................ 324/760 |
| 5,036,911 A | * | 8/1991 | So et al. ..................... 165/153 |
| 5,063,475 A | * | 11/1991 | Balan ......................... 361/687 |
| 5,063,476 A | * | 11/1991 | Hamadah et al. ........... 361/697 |
| 5,077,601 A | * | 12/1991 | Hatada et al. ............... 257/722 |
| 5,099,908 A | * | 3/1992 | Taraci et al. ................ 165/272 |
| 5,150,278 A | * | 9/1992 | Lynes et al. ................ 361/690 |
| 5,164,541 A | * | 11/1992 | Leyssens et al. .......... 174/15.2 |
| 5,203,399 A | * | 4/1993 | Koizumi ................ 165/104.33 |
| 5,268,812 A | * | 12/1993 | Conte ......................... 361/698 |
| 5,283,715 A | * | 2/1994 | Carlsten et al. ............. 361/702 |
| 5,285,347 A | * | 2/1994 | Fox et al. ................... 361/699 |
| 5,321,327 A | * | 6/1994 | Jensen ......................... 310/11 |
| 5,329,425 A | * | 7/1994 | Leyssens et al. ........... 361/701 |
| 5,329,993 A | * | 7/1994 | Ettehadieh ............. 165/104.14 |
| 5,333,676 A | * | 8/1994 | Mizuno ....................... 165/294 |
| 5,348,076 A | * | 9/1994 | Asakawa ..................... 165/282 |
| 5,355,942 A | * | 10/1994 | Conte .................... 165/104.33 |

(List continued on next page.)

Primary Examiner—Nicholas Ponomarenko
Assistant Examiner—Pedro J. Cuevas
(74) Attorney, Agent, or Firm—Sonnenschein, Nath & Rosenthal LLP

(57) ABSTRACT

A method for converting lower temperature dissipated heat to other useful energy and apparatus therefore. Heat energy is transferred to a fluid contained within a conduit, and natural convection of the fluid is utilized to transfer kinetic energy of the heat to another type of energy such as electrical energy.

28 Claims, 4 Drawing Sheets

U.S. PATENT DOCUMENTS

| | | | | |
|---|---|---|---|---|
| 5,361,188 A | * | 11/1994 | Kondou et al. | 361/695 |
| 5,390,077 A | * | 2/1995 | Paterson | 361/700 |
| 5,394,936 A | * | 3/1995 | Budelman | 165/104.33 |
| 5,441,102 A | * | 8/1995 | Burward-Hoy | 165/104.25 |
| 5,513,071 A | * | 4/1996 | LaViolette et al. | 361/703 |
| 5,587,880 A | * | 12/1996 | Phillips et al. | 361/687 |
| 5,613,552 A | * | 3/1997 | Osakabe et al. | 165/104.21 |
| 5,637,934 A | * | 6/1997 | Fabris | 310/11 |
| 5,666,814 A | * | 9/1997 | Yamamoto | 62/118 |
| 5,761,037 A | * | 6/1998 | Anderson et al. | 361/700 |
| 5,763,951 A | * | 6/1998 | Hamilton et al. | 257/714 |
| 5,822,187 A | * | 10/1998 | Garner et al. | 361/687 |
| 5,829,516 A | * | 11/1998 | Lavochkin | 165/80.4 |
| 5,832,989 A | * | 11/1998 | Osakabe et al. | 165/104.33 |
| 5,864,466 A | * | 1/1999 | Remsburg | 361/700 |
| 5,884,693 A | * | 3/1999 | Austin et al. | 165/104.33 |
| 5,953,930 A | * | 9/1999 | Chu et al. | 62/259.2 |
| 5,959,836 A | * | 9/1999 | Bhatia | 361/687 |
| 6,005,772 A | * | 12/1999 | Terao et al. | 361/699 |
| 6,055,157 A | * | 4/2000 | Bartilson | 361/699 |
| 6,076,595 A | * | 6/2000 | Austin et al. | 165/104.26 |
| 6,102,110 A | * | 8/2000 | Julien et al. | 165/104.33 |
| 6,105,662 A | * | 8/2000 | Suzuki | 165/104.33 |
| 6,148,906 A | * | 11/2000 | Li et al. | 165/104.33 |
| 6,220,340 B1 | * | 4/2001 | Cheong et al. | 165/103 |
| 6,223,810 B1 | * | 5/2001 | Chu et al. | 165/104.33 |
| 6,310,406 B1 | * | 10/2001 | Van Berkel | 290/43 |
| 6,313,994 B1 | * | 11/2001 | Tantoush | 361/704 |
| 6,341,646 B1 | * | 1/2002 | Tanaka et al. | 165/104.33 |
| 6,366,460 B1 | * | 4/2002 | Stone et al. | 361/687 |
| 6,382,306 B1 | * | 5/2002 | Hsu | 165/80.3 |
| 6,388,882 B1 | * | 5/2002 | Hoover et al. | 361/704 |
| 6,394,175 B1 | * | 5/2002 | Chen et al. | 165/80.3 |
| 6,408,937 B1 | * | 6/2002 | Roy | 165/104.33 |
| 6,412,551 B1 | * | 7/2002 | Tustaniwskyj et al. | 165/264 |
| 6,527,045 B1 | * | 3/2003 | Osakabe et al. | 165/104.33 |
| 6,536,510 B2 | * | 3/2003 | Khrustalev et al. | 165/104.33 |
| 6,550,529 B1 | * | 4/2003 | Horng et al. | 165/80.3 |
| 6,580,609 B2 | * | 6/2003 | Pautsch | 361/698 |
| 6,580,610 B2 | * | 6/2003 | Morris et al. | 361/699 |
| 6,591,610 B2 | * | 7/2003 | Yazawa et al. | 60/527 |
| 6,595,006 B2 | * | 7/2003 | Thiesen et al. | 62/6 |
| 6,595,270 B2 | * | 7/2003 | Machiroutu et al. | 165/104.26 |
| 6,628,520 B2 | * | 9/2003 | Patel et al. | 361/696 |
| 6,643,132 B2 | * | 11/2003 | Faneuf et al. | 361/700 |
| 6,657,121 B2 | * | 12/2003 | Garner | 174/16.3 |
| 6,662,858 B2 | * | 12/2003 | Wang | 165/80.3 |
| 6,668,911 B2 | * | 12/2003 | Bingler | 165/80.4 |
| 6,687,126 B2 | * | 2/2004 | Patel et al. | 361/699 |
| 6,712,621 B2 | * | 3/2004 | Li et al. | 439/65 |
| 6,713,866 B2 | * | 3/2004 | Simon et al. | 257/714 |
| 6,717,812 B1 | * | 4/2004 | Pinjala et al. | 361/699 |
| 6,717,813 B1 | * | 4/2004 | Garner | 361/700 |
| 6,722,139 B2 | * | 4/2004 | Moon et al. | 62/3.2 |
| 6,725,668 B1 | * | 4/2004 | Cornwall | 62/3.1 |
| 6,725,670 B2 | * | 4/2004 | Smith et al. | 62/6 |
| 6,729,389 B2 | * | 5/2004 | Ohashi | 165/168 |
| 6,736,201 B2 | * | 5/2004 | Watton et al. | 165/166 |
| 6,742,583 B2 | * | 6/2004 | Tikka | 165/291 |
| 6,743,539 B2 | * | 6/2004 | Clingerman et al. | 429/24 |
| 6,745,823 B2 | * | 6/2004 | Brost | 165/80.4 |
| 6,755,026 B2 | * | 6/2004 | Wallach | 62/3.7 |
| 6,760,221 B2 | * | 7/2004 | Goth et al. | 361/699 |
| 6,760,222 B1 | * | 7/2004 | Wang | 361/700 |
| 6,789,611 B1 | * | 9/2004 | Li | 165/104.29 |
| 6,799,428 B1 | * | 10/2004 | Stollenwerk | 62/3.7 |
| 6,799,628 B1 | * | 10/2004 | Masseth et al. | 165/80.4 |
| 6,804,114 B1 | * | 10/2004 | Greer | 361/687 |
| 6,804,117 B2 | * | 10/2004 | Phillips et al. | 361/700 |

\* cited by examiner

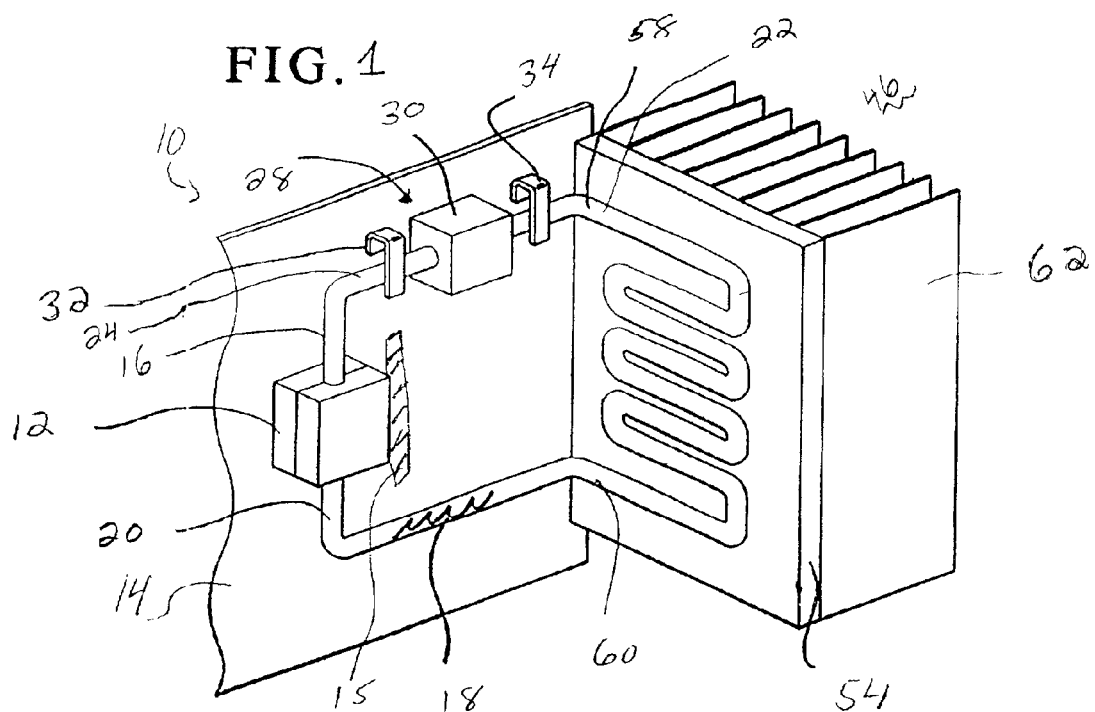
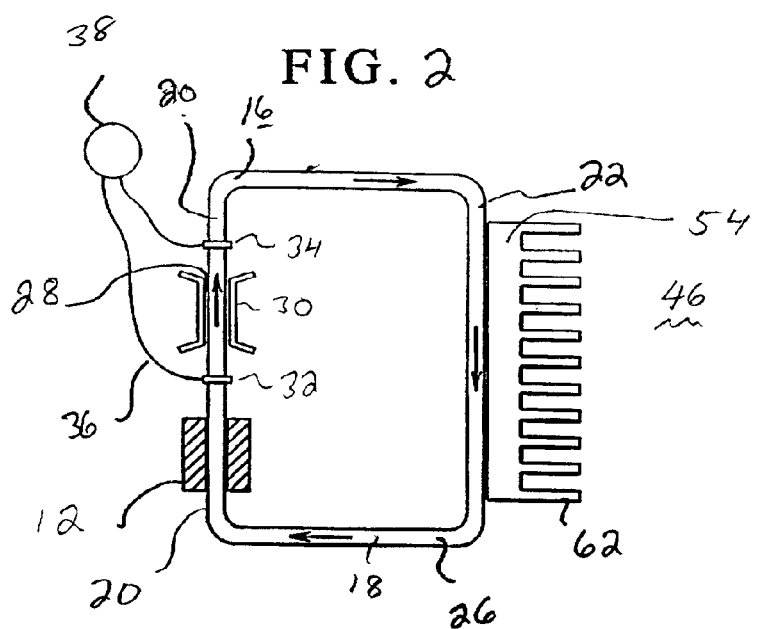

METHOD AND APPARATUS FOR CONVERTING DISSIPATED HEAT TO WORK ENERGY

BACKGROUND OF THE INVENTION

The present invention generally relates to methods and apparatuses for dissipating heat away from devices generating heat. In addition, the invention relates to methods and other apparatuses for converting heat energy into other forms of energy.

The research and development of liquid metal magneto hydro dynamic energy conversion systems is gaining increasing attention in their various proposed modes, consisting of single-phase or two-phase fluid flow for a wide range of heat sources, e.g., solar energy, waste heat, nuclear energy, etc. Since the thermodynamic "availability," or energy content, of a solid or fluid increases strongly with absolute temperature, efficient electric power generation from a heat source is usually performed at elevated temperatures, often in the range of 600° C.–800° C. In the categories of high temperature conversion, the systems are generally large, with each generator unit producing megawatts of electric power and occupying a volume of 10 $m^3$ to 100 $m^3$. Alternatively, lower temperature equipment operating between 100° C. and 200° C. have been developed to recover energy from solar-concentrated heated fluids and geothermal sources and waste heat rejected by high temperature conversion systems.

One prior art approach is taught by U.S. Pat. No. 3,878,410, issued to the United States Energy Research and Development Administration, which is directed to a two-phase liquid metal magnetohydrodynamic generator. The '410 patent uses a gas injected into a liquid metal which reduces the density of the liquid metal causing an increased convection flow of the liquid metal within a channel. The liquid metal flows past a heat source where the heat is transferred to the liquid metal. This prior art contains deficiencies, though. For example, as disclosed, the '410 patent requires a pump to circulate the liquid metal through the channel. This additional pump not only adds components to the system and requires maintenance; but also, consumes electrical power. Thus, the '410 patent has to pay an electrical energy penalty for the required pumping. Further, the pump adds vibrational and acoustical interference to the system.

In the marketplace, many products generate heat in the temperature range below 150° C. For example, electrical components, such as integrated circuits including a central processor unit (CPU) for a computer, operating in close proximity in an enclosed electronic apparatus produce heat. To prevent thermal failure of one of the electrical components in the enclosed electronic apparatus this heat needs to be dissipated. These enclosed electronic apparatuses are common and typically include personal computers, laptop computers, display monitors, computer peripherals, television sets, projectors, projection monitors, handheld personal digital assistants (PDAs), cellular phones, facsimile machines, video cassette recorders (VCRs), digital versatile disc (DVD) players, audio systems and similar equipment. Further, slightly larger equipment, such as refrigerators, washers, dryers and other similar appliances also may generate heat in this low temperature range.

Thermal management of the electronic components in the enclosed electronic apparatus is necessary to prevent the enclosed electronic apparatus from failing or to extend the useful life of the enclosed electronic apparatus. For instance, a typical CPU operating in a personal computer may operate at a maximum temperature of 70° C. without experiencing a thermal failure; but due to the heat generated by a typical CPU, however, the temperature often reaches 100° C. and above which could lead to thermal failure.

SUMMARY OF THE INVENTION

The present invention provides a heat dissipating device and method useful for converting heat energy to work energy operating in low temperature ranges and with low temperature differentials.

In an embodiment, the invention provides a heat dissipating device and method in which heat dissipated by an electrical component is converted to work energy. In this device a fluid conduit channels a fluid therethrough in accordance with principles of convection. As used herein, a "fluid" unless otherwise noted is included to mean any suitable flowable medium.

In an embodiment, the fluid conduit comprises a first column in which the fluid is heated and a second column in which the fluid is cooled. A first portion connects the first column and the second column in fluid communication. A second portion connects the second column to the first column in fluid communication to return the fluid from the second column to the first column. The first column thermally connects to an electrical component, which generates heat in the temperature range of 75° C. to 150° C. thereby creating a temperature rise within the first column. The temperature rise heats the fluid causing a density differential of the fluid within the fluid conduit. The density differential forms a convective flow of the fluid through the fluid conduit.

In an embodiment, the invention provides that the fluid is electrically conductive and that the flow circulates the electrically conducting fluid through a energy converter that is operatively associated with the fluid conduit at a point typically downstream from the electrical component. The energy converter may comprise a magneto hydro dynamic generator having a first electrode, a second electrode and a permanent magnet centrally displaced between the first electrode and the second electrode. The permanent magnet creates a magnetic field across the fluid whereby an electric potential is raised between the first electrode and the second electrode. A plurality of electrical leads coupled to the first electrode and the second electrode transfers the electricity derived from the electric potential to an external circuit load, which is capable of supplying a power source.

In another embodiment, a volatile fluid is immersed in the fluid. The volatile fluid has a lower boiling point than the fluid which evaporates to create gas bubbles within the fluid. The bubbles are configured to increase local buoyancy and to thereby increase the fluid flow.

In an embodiment, the invention provides that a heat exchanger is operatively positioned on the second column where the heat exchanger is thermally connected to the second column for transferring heat out of the fluid across heat fins into a heat reservoir. The cooling effect of the heat exchanger increases the density of the fluid where the fluid typically downwardly flows through the heat exchanger.

The present invention also provides for methods of dissipating waste heat from an electrical environment to produce electricity comprising the steps of channeling an fluid through a closed conduit. The density of the fluid is differentiated by thermally connecting the closed conduit to the electrical component generating heat causing the fluid to flow by convection through the closed conduit.

In one method, the convective flow may further be increased by immersing a volatile fluid in the fluid where the volatile fluid has a lower boiling point than the fluid. The volatile fluid evaporates creating gas bubbles when passing the electrical component which further increases the density differential.

In another method, energy is generated by directing the fluid through a energy converter and transferring by electrical leads the electricity generated to an electrical storage. The energy converter may comprise a first electrode, a second electrode and a permanent magnet centrally displaced therebetween. The permanent magnet creates a magnetic field across the fluid whereby an electric potential is raised between the first electrode and the second electrode with each electrode deriving electricity across the electric potential.

In another method, the heat from the fluid is dissipated by a heat exchanger for maintaining the differential of the density. In this method, the heat exchanger transfers the heat through heat fins to a heat reservoir.

The present invention has many advantages. These advantages relate to cooling an electrical component and generating energy from the heat emitted by the electrical component.

It is an advantage of the present invention to transfer heat emitted from the electrical component through a heat exchanger to a heat reservoir without requiring additional energy.

It is still further an advantage of the present invention to generate electricity from heat dissipated from the electrical component without requiring additional energy.

It is still further an advantage of the present invention to thermally induce a convective flow of an fluid through a magnetic field to create electricity which can be delivered to an external electrical storage.

It is further an advantage of the present invention to provide a method of generating energy from heat dissipated from an electrical component without requiring additional energy.

It is still further an advantage of the present invention to provide a method of transferring heat from the electrical component through a heat exchanger to a heat reservoir without requiring additional energy.

These and other advantages and features of the invention are described in greater detail in the following detailed description of the presently preferred embodiments with reference to the accompanying drawings.

BRIEF DESCRIPTION OF THE DRAWINGS

FIG. 1 illustrates in perspective view a heat dissipating device embodying principles of the invention.

FIG. 2 illustrates in schematic form a first heat dissipating device or arrangement embodying principles of the invention.

DETAILED DESCRIPTION OF THE PREFERRED EMBODIMENTS

Figure 3:
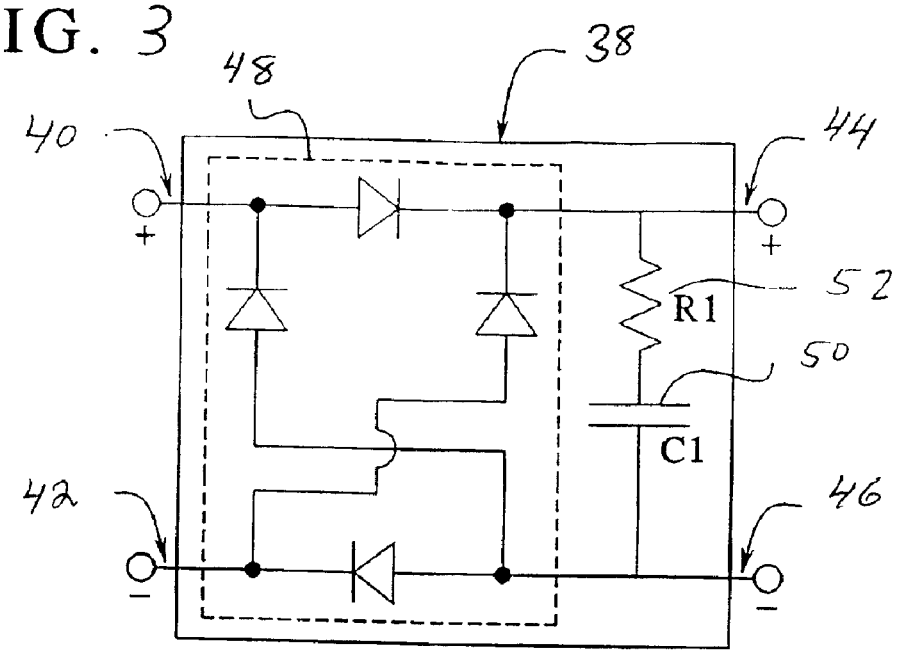
FIG. 3 illustrates a schematic form of an electrical storage device embodying principles of the invention.

As discussed above, there is provided an apparatus and method for efficiently transferring unconverted or remaining waste heat away from a heat source, such as an electrical component, and for converting waste heat from the heat source into other forms of energy such as work energy.

The present invention is directed to converting waste heat for energy conversion in a 75° C.–150° C. temperature range into other useful energy. As mentioned above and described more fully below, in accordance with principles of the invention, power is derived from waste heat via an energy converter producing approximately 1W–10W yet only occupying several $cm^3$ of volume. Thus, the present invention can generate power derived from the waste heat for output for operating other devices for cooling purposes (such as a fan or a miniature refrigerator), extending battery life, re-charging depleted batteries, and reducing the electricity demand on the power grid in the office or home.

FIG. 1 illustrates in perspective view an exemplary heat dissipating device or arrangement 10 to convert heat energy or waste heat into work energy in accordance with general principles of the invention. In FIG. 1, the heat dissipating device 10 is thermally connected to an electrical component 12 of an electrical device 14.

The electrical component 12 may be one of a plurality of electrical components 12 that are part of the electrical device 14. Electrical components 12 may be any device that gives off heat when operating or when power is supplied to the electrical components 12. Electrical components 12 may be heat sources that emit heat at a temperature up to 150° C. before thermal breakdown. As illustrated in FIG. 1, the electrical device 14 may be attached to a circuit board 26 that supports and provides electrical interconnections between the electrical components 12. The heat emitted by the electrical components 12 must be dissipated away to assure proper and reliable operation. The present invention transfers the heat generated by the electrical components 12 from being transferred out of the electrical device 14.

As shown in FIG. 1, the heat dissipating device 10 includes a fluid conduit 16 configured to receive heat and configured to dissipate heat. The fluid conduit 16 also includes a fluid 18 which is thermally conductive that substantially fills the fluid conduit 16. The fluid conduit 16 comprises a first column 20 and second column 22 shown as two vertical columns interconnected at the top and the bottom by a first portion 24 and a second portion 26. The first portion 24 supplies the fluid 18 to the second column 22 and the second portion 26 returns the fluid 18 to the first column 20 from the second column 22. The fluid conduit 16 can embody different shapes as the first column 20, second column 22, first portion 24 and second portion 26 may contain vertical and horizontal bends to accommodate the electrical components 12 or other equipment housed inside an equipment enclosure 15.

The fluid 18 should be non-corrosive to the fluid conduit 16 wherein the fluid 18 may be a gas or a liquid. Preferably, the fluid 18 is an electrically conductive fluid. Suitable materials for the fluid 18 include liquid metal such as liquid mercury, ionized organic materials, sodium or potassium, or liquids containing these materials. The organic materials offer the benefits of being light-weight and being safe for handling. Essentially, these fluids 13 contain electric ions in which the ions are easily exchanged inducing electrical flow as known in the art. Preferably, the fluid 18 flowing in the fluid conduit 16 is a liquid metal, such as liquid mercury.

Liquid mercury is advantageous because of its high electrical conductivity, high density, and low specific heat value, but other fluids 13 such as an electrolytic solution may also be used, depending on cost considerations, equipment design or availability, and other factors known in the art. Because of the safety concerns with some of these liquid metals, the fluid conduit 16 may be a closed system.

The thermal energy given off by the electrical component 12 increases the temperature of the fluid 18 in the first column 20 relative to the fluid 18 in the second column 22 so that a density differential is established between the first column 20 and the second column 22. The first column 20 in which the fluid 18 rises is heated to a temperature of approximately 150° C. by a thermal source such as the electrical component 12 which changes the density by adding heat to the fluid 18. The fluid 18 flows down the second column 22 where the heat exchanger 54, connected to a heat reservoir 46 as shown in FIG. 2, cools the fluid 18 is to a lower temperature. The difference in the density of the fluid 18 in the first column 20 and second column 22 induces a convective flow of the fluid 18 through the fluid conduit 16. Thus, the greater the temperature differential that can be established, the greater the convective flow of the fluid 18.

As shown in FIG. 2, the heat exchanger 54 maintains the temperature differential between the fluid 18 in the first column 20 and the second column 22. The heat exchanger 54, preferably located on the second column 22, may be connected to a heat reservoir 46 capable of absorbing from the fluid 18 the heat generated by the electrical component 12.

Preferably, the fluid conduit 16 is a closed system. On the opposite side of the electric component 12, heat must be removed to the heat reservoir 46 such as the ambient air outside the electrical device 14 by the heat exchanger 54. The heat exchanger 54 is of the type typically employed in the art where the second column 22 enters the heat exchanger 54 at an inlet 58 and exits at an outlet 60 (shown in FIG. 1). Preferably, the heat exchanger 54 employs heat fins 62 to dissipate the heat into the heat reservoir 46

As a result of the heat exchanger 54, the fluid 18 cools down and becomes denser in the second column 22 than the first column 20. Returning to FIG. 1, the resulting density gradient in the cooled section of the second column 22 induces flow of the fluid 18 downward along the gravity vector within the second column 22.

Referring to FIG. 2, the heat dissipating device 10 further comprises an energy converter 28 such as a magneto hydro liquid generator in order to convert the heat emitted by the electrical component 12. The energy converter 28 is used for small heat dissipations in a low temperature range, such as between room temperature and 150° C. The energy converter 28 generates electric power from the waste heat of the electric component 12. To maximize the electric power output from the energy converter 28, the heat exchanger 54 is designed to maintain the cool side temperature. Further, to extract maximum power, the load resistance of any external electrical storage 38 should be designed to match the energy converter 28.

As shown in FIG. 2, the energy converter 28 is operatively associated to the fluid conduit 16 by surrounding the fluid conduit 16. Excellent results are obtained when the energy converter 28 is positioned downstream from the electrical component 12 to receive the fluid 18 with the most velocity. The energy converter 28 comprises a permanent magnet 30 that creates a strong magnetic field perpendicular to the flow of the fluid 18. The permanent magnet 30 is designed for the fluid 18 to pass between the poles of the permanent magnet 30 which are closely positioned to maximize the intensity of the magnetic field across the fluid 18 passing through.

To generate energy such as electrical energy, the fluid 18 is circulated through the magnetic field, which leads to the ionization of the fluid 18 to create current flow as known by those skilled in the art. As the fluid 18 flows through the permanent magnet 30, an electric potential is generated between a first electrode 32 and a second electrode 34 causing an electric current to flow through the first electrode 32 and the second electrode 34 from which electricity may be drawn. The first electrode 32 is located upstream of the permanent magnet 30 while the second electrode 34 is located downstream of the permanent magnet 30. In order to produce the electric potential, the fluid 18 is passed through the magnetic field perpendicular to the direction in which the fluid 18 is flowing. The electric potential develops between points on the fluid 18 that lie on a plane perpendicular to the direction of the convective flow and the direction of the magnetic field as commonly known in the art.

The first electrode 32 and the second electrode 34 are further connected to a plurality of electrical leads 36 to carry the electricity. The electrical device 14 may also include the electrical storage 38, such as a capacitor or battery, that is adapted to store the electricity from the plurality of electrical leads 36. The heat dissipating device 20 may transfer the work energy in the form of electricity to the electrical storage 38. The electrical storage 38 may be operably connected to a load device (not shown) to provide power to the load device. The load device is preferably a box fan or other cooling apparatus that would utilize the power from the electrical storage 38 to further dissipate heat out of the electrical device 14.

Turning to FIG. 3, the electrical storage 38 is shown in schematic form. The electrical storage 38 has a positive input 40 and a negative input 42 that are each electrically connected to a respective positive and negative electrode (not shown) of the energy converter 28. The electrical storage 38 receives and stores the voltage from energy converter. The electrical storage 38 also has a first and a second output 44 and 46 that can be connected to the load device to provide power to the load device.

The electrical storage 38 may include a standard full-wave rectifier 48 and a capacitor 50 that is electrically connected to the full-wave rectifier 48. The full-wave rectifier 48 converts the asynchronous current received from the energy converter 62 to a D.C. voltage that is stored in the capacitor 50. The electrical storage 38 also includes a resistor 52 that controls the current flow to the load device that may be connected to the first and second outputs 44 and 46 of the electrical storage 38. It is contemplated that the electrical storage 38 may include any means known in the art for receiving an alternating current, transforming the alternating current to a direct current, and storing the voltage transported by the direct current. Thus, the energy converter 28 converts the kinetic energy of the fluid 18 to energy, preferably electrical energy, which can be stored in the electrical storage 38.

Accordingly, directing the convective flow through a permanent magnet 30 yields the desired electric current, without the use of pumps or additional components. Therefore, no additional energy would be required to transfer the heat off the electrical component 12 and to generate electricity. It should be noted that other embodiments of the present invention could use any type of generator such as but not limited to a thermoelectric generator that converts kinetic energy of a moving fluid to electric energy as known to those skilled in the arts.

Figure 4:
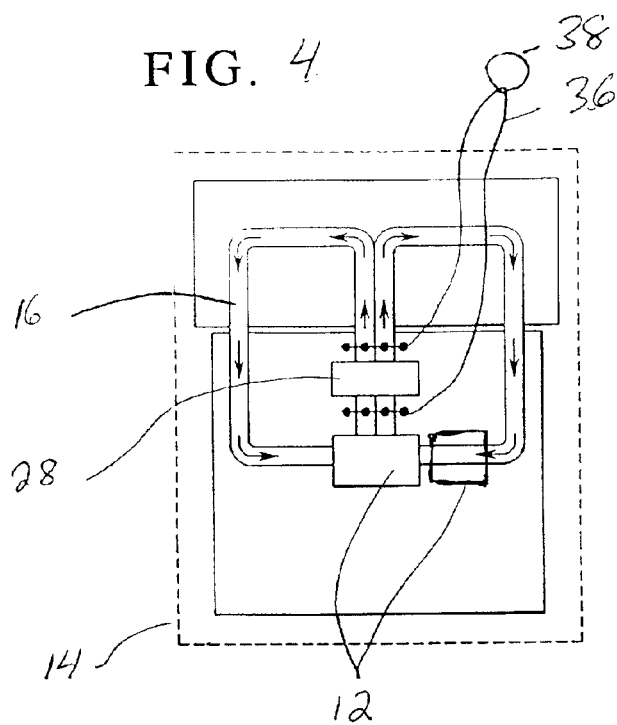
FIG. 4 illustrates in schematic form another embodiment embodying principals of the invention.
Figure 5:
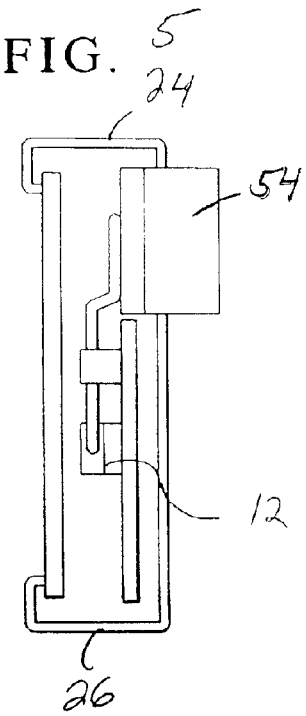
FIG. 5 illustrates in elevational view the embodiment of FIG. 4.

FIGS. 4 and 5 depict in schematic and elevational form another embodiment of the invention employing other principles of the invention. As the plurality of components 12 may exist within the electrical device 14, an alternative embodiment may contain a plurality of fluid conduits 16 as shown in FIG. 4. As such, each component 12 may connect to an individual fluid conduit 16. Alternatively, the fluid conduit 16 may connect to the plurality of components 12. Additionally, the plurality of fluid conduits 16 may flow through a single energy converter 28. Further, the plurality of fluid conduits 16 may flow through a plurality of energy converters 24. Accordingly, an alternative embodiment could employ a plurality of heat exchangers 54.

Figure 6:
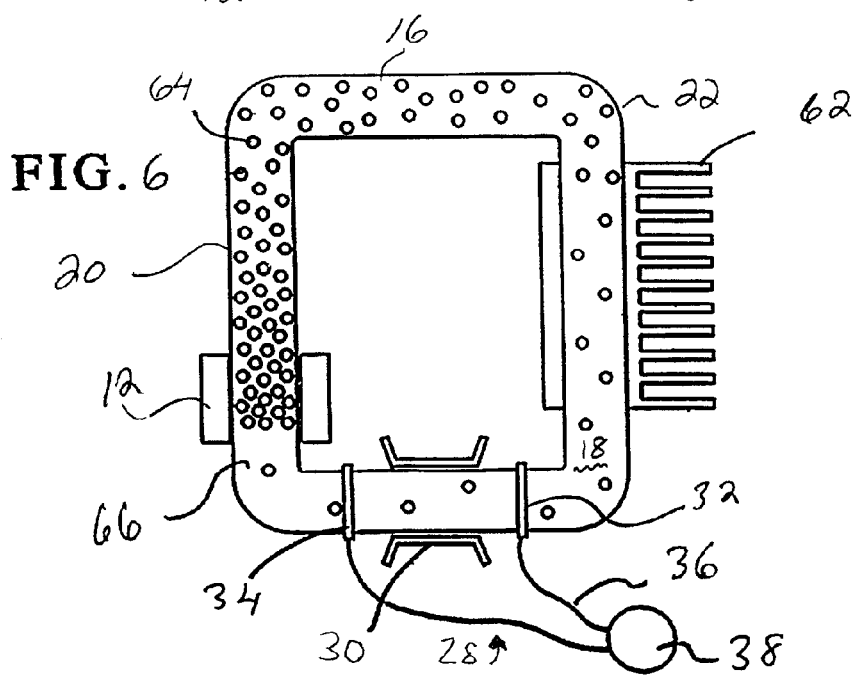
FIG. 6 illustrates in schematic form yet another embodiment embodying principles of the invention.

FIG. 6 depicts in schematic form another embodiment of the present invention embodying other principles of the invention. Due to the difficulty in identifying fluids 13 with superior thermofluid and magneto-electric properties, the heat conversion efficiency may be limited. Another embodiment of the present invention enhances the driving force for circulation of the fluid 18 by introducing additional buoyancy through the generation of gas bubbles 64.

In this other embodiment, a volatile liquid 66 with a low boiling point, such as Freon, is introduced into the fluid 18. If the volatile liquid 66 is selected to have a boiling point substantially lower than the temperature of the fluid 18, the volatile liquid 66 experiences "flash evaporation" creating gas bubbles 64 upon passing the electrical component 12 as shown in FIG. 6. The rapid expansion of the volatile liquid 66 then propels the fluid 18 at a higher flow rate through the permanent magnet 30, yielding a larger electric current.

In this embodiment it should be noted that the volatile liquid 66 can be those liquids known in the art and can further include, but is not limited to, Freons, FC's, HFC's and alcohols. The volatile liquid 66 should be carefully selected according to the temperature range of operation, so that it evaporates explosively in the heated section of the first column 20 and condenses in the cooled section of the second column 22. Alternatively, the volatile liquid 66 can remain in the gaseous state throughout the fluid conduit 16, expanding in the heated section of the first column 20 and contracting in the cooled section of the second column 22 of the fluid conduit 16.

By introducing the gas bubbles 64 in the first column 20, the efficiency of the heat dissipating device 10 can be greatly increased due to the increased rate of convective flow of the fluid 18. When the gas bubbles 64 are introduced into the first column 20, the density and weight of the fluid 18 in the first column 20 is substantially decreased, which increases the density and weight differentials between the fluid 18 in the first column 20 and the fluid 18 in the second column 22.

This increased density differential greatly enhances the convective flow of the fluid 18 around the fluid conduit 16, increasing the rate of convective flow of the fluid 18 through the energy converter 28, which further increases the production of electrical energy. Since the expansion of the gas bubbles 64, caused by the temperature rise, is larger than the expansion of the fluid 18, the buoyancy induced by the gas bubbles 64 will increase the convective flow. Therefore, the desired circulation rate of the fluid 18 can be established by the choice and concentration of the volatile liquid 66 based on favorable magneto-electric characteristics.

As shown in FIG. 6, because the volatile fluid is at a very high pressure as it enters the first column 20, the gas bubbles 64 are small. As the gas bubbles 64 move within the first column 20 with the fluid 18, the gas bubbles 64 expand in size. These expanding gas bubbles 64 further increase the convective flow of the fluid 18 through the fluid conduit 16 as the gas bubbles 64 push the surrounding fluid 18 forward against the force caused by the interaction of the electrical currents and the magnetic field where the electrical energy is extracted.

An excessive amount of gas bubbles 64, occupying approximately 35% of the cross-section of the fluid conduit 16, however, may reduce the performance of the energy converter 28, though. Large gas bubbles 64, approaching half the diameter of the fluid conduit 16, hinder the convective flow. Consequently, excellent results are obtained when the maximum diameter of the gas bubbles 64 is less than half of a smallest diameter of the fluid conduit 16.

Further, to operate continuously in the heat dissipating device 10, it is essential that the volatile liquid 66 is preferably well contained to prevent leakage out of the fluid conduit 16. Moreover, to maintain the volatile fluid in the liquid state, the fluid 18 can be selected so as to maintain the appropriate maximum pressure in the section of the fluid conduit 16 where the maximum heat is applied.

As shown in FIG. 6, the volatile liquid 66 is immersed in the fluid 18. It should be noted that other embodiments may inject the volatile liquid 66 as known in the art. Thus, injectors (not represented) may inject the volatile liquid 66 from containers (not represented) through nozzles (not represented) into the fluid conduit 16 or by other means for injecting gasses and liquids known to those skilled in the art.

Figure 7:
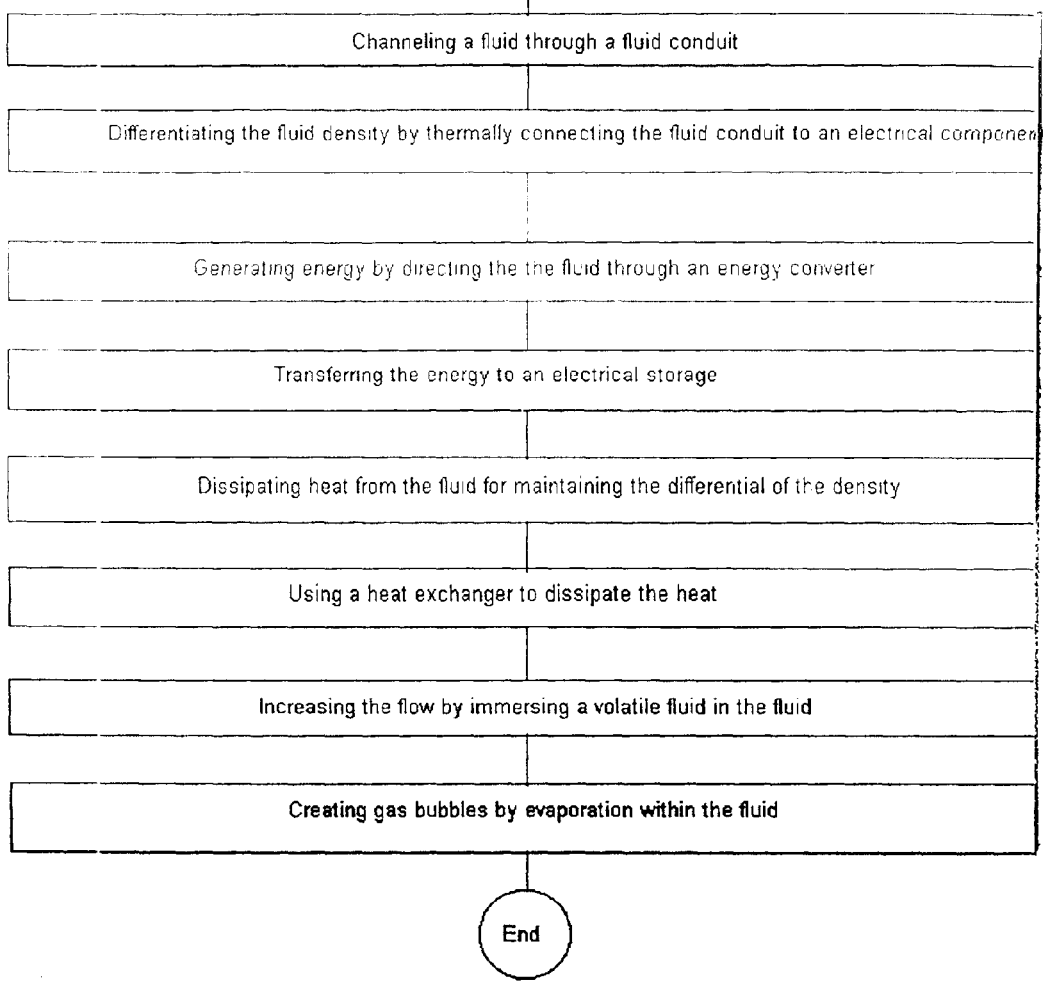
FIG. 7 is a flowchart depicting an exemplary process for dissipating heat and for generating energy from the dissipated heat.

In FIG. 7, a flowchart of an exemplary process for dissipating heat from the electrical component 12 to the ambient and for producing energy from the dissipated heat is shown. In use, the heat dissipating device 10 uses the thermally induced buoyancy to circulate the fluid 18, without any other power source. Thus, unlike turbines and conventional generators, the heat dissipating device 10 does not have any moving mechanical parts eliminating maintenance, bearing and lubrication problems. Further, without additional power sources, work space problems and corrosion problems are eliminated.

The buoyancy force of the fluid 18 is generalized by the following equation $$F = \rho g V \beta \Delta T$$

Where, $\rho$: density, g: gravity, V: volume, $\beta$: thermal expansion ration, $\Delta T$: temperature increase Since a primary objective of the heat dissipating device 10 is to control the temperature of the electrical component 12, the thermal requirements establish the temperature difference between the electrical component 12 and the ambient air outside the electrical device 14. The fluid 18 receives the thermal energy from the electrical component 12 and expands thermally which reduces the density of the fluid 18. The resulting density gradient within the fluid conduit 16 generates a buoyancy force to accelerate the now heated fluid 18 moving it through the fluid conduit 16. It should be noted that the characteristics of the fluid conduit 16 are designed for viscous and frictional effects to efficiently effect the flow rate of the fluid 18. Further, the magnitude of the circulation depends on the thermofluid properties of the fluid 18, including density, volumetric coefficient of thermal expansion, viscosity, and thermal conductivity, as well as the magnetic and electrical properties of the liquid. Accordingly, depending on the configuration of the electrical components 12, the electrical device 14 and the fluid conduit 16, a variety of fluids 13 may be used.

The present invention is primarily concerned with generating electric current using the temperature rise of operating components 12 to heat the fluid 18 and to remove the heat. The working fluid is circulated by the buoyancy of the fluid 18 itself. This buoyancy-induced circulation of the fluid 18 can be harnessed for work through use of the energy converter 28 which emits a strong magnetic field to produce the electric potential between the permanent magnet 30 of the energy converter 28 through which the fluid 18 flows The magnitude of the power generated with a given fluid 18 is proportional to the velocity of the fluid 18 flowing through the permanent magnet 30.

Controlling the temperature rise of the electrical components 12, though, requires heat transfer to the heat reservoir 46 from which convection can remove the heat out of the electrical device 14. Since the preferred embodiment is concerned with consumer electronics, or electronic equipment used in similar situations, the heat transfer system should be enclosed in the electrical device 14. Therefore, the ambient air outside the electrical device 14 may serve as the final heat reservoir 46 and heat must be transferred to the air by convection.

Accordingly, the method provides channeling the fluid 18 through the fluid conduit 16 which is thermally connected to the electrical component 12 generating heat. The heat causes the fluid 18 to flow by convection by changing the density of the fluid 18. The flow may be increased further by immersing a volatile liquid 66 fluid within the fluid 18. The volatile liquid 66 has a lower boiling point than the fluid 18 where the volatile liquid 66 will evaporate when passing the electrical component 12 creating gas bubbles 64 which further increases the density differential of the fluid 18.

Next, the fluid 18 is directed through a energy converter 28 which comprises the first electrode 32, the second electrode 34 and the permanent magnet 30 centrally displaced therebetween. The permanent magnet 30 creates a magnetic field across the fluid 18 whereby an electric potential is raised between the first electrode 32 and the second electrode 34. The first electrode 32 and the second electrode 34 derive electricity across the electric potential and transfers it to an external load by electrical leads 36. Then, the heat exchanger 54 reduces the density of the fluid 18. The heat exchanger 54 maintains the differential of the density by removing heat from the fluid 18 through heat fins 62 and out to the heat reservoir 46.

Although the foregoing detailed description of the present invention has been described by reference to various embodiments, and the best mode contemplated for carrying out the prevention invention has been herein shown and described, it will be understood that modifications or variations in the structure and arrangement of these embodiments other than there specifically set forth herein may be achieved by those skilled in the art and that such modifications are to be considered as being within the overall scope of the present invention.

What is claimed is:

1. A heat dissipating device for dissipating heat from an electrical component and for generating energy, comprising:
    a fluid conduit configured to channel a fluid therethrough, the fluid conduit being thermally connected to the electrical component capable of generating heat when in operation to cause the fluid to flow through the fluid conduit, wherein the fluid is an electrically conductive fluid;
    a heat exchanger operatively positioned between the electrical component and the fluid conduit; and
    an energy converter operatively coupled to the fluid conduit that generates energy in response to the flow of fluid, wherein the energy converter includes a first electrode, a second electrode and a permanent magnet centrally displaced between them, the permanent magnet configured to create a magnetic field across the fluid whereby an electric potential is raised between the first electrode and the second electrode.

2. The heat dissipating device of claim 1, wherein the fluid conduit includes a first column and a second column, a first connective portion connecting the first column and the second column, a second connective portion connecting the second column to the first column wherein the first column being thermally connected to the electrical component.

3. The heat dissipating device of claim 1, wherein the fluid is a liquid metal.

4. The heat dissipating device of claim 1, wherein the energy generated is electrical energy.

5. The heat dissipating device of claim 1, wherein the energy converter is a liquid magneto hydro generator.

6. The heat dissipating device of claim 1, wherein the electrical component is adapted to generate heat at less than or equal to 150° C.

7. The heat dissipating device of claim 1, wherein a volatile fluid is immersed in the fluid, the volatile fluid having a lower boiling point than the fluid.

8. The heat dissipating device of claim 7, wherein the volatile fluid evaporates due to the heat transferred to the fluid to create gas bubbles in the fluid to further increase fluid flow of the fluid through the energy converter.

9. The heat dissipating device of claim 8, wherein the gas bubbles have diameters less than half a smallest diameter of the fluid conduit.

10. The heat dissipating device of claim 1, wherein the heat exchanger is thermally coupled to the second column and configured to extract heat from the fluid and dissipate the extracted heat.

11. The heat dissipating device of claim 1, wherein the heat exchanger dissipates the heat across a plurality of heat fins into a heat reservoir.

12. A heat dissipating device for dissipating heat from an electrical component and for generating energy, comprising:
    an electrical component which generates heat when in operation;
    a fluid conduit, the fluid conduit configured to channel an fluid therethrough, the fluid conduit being thermally connected to the electrical component to cause a fluid flow of the fluid through the fluid conduit;
    a volatile fluid, the volatile fluid being immersed in the fluid wherein the volatile fluid has a lower boiling point than the fluid; and
    a energy converter, the energy converter operatively coupled to the fluid conduit to generate energy in response to the fluid flow, the energy converter positioned downstream of the electrical component.

13. The heat dissipating device of claim 12, wherein the fluid conduit comprises a closed conduit having a first column, a second column and at least one connective portion connecting the first column to the second column.

14. The heat dissipating device of claim 12, further comprising a heat exchanger thermally connected to the fluid conduit.

15. The heat dissipating device of claim 14, wherein the heat exchanger is operatively positioned opposite the electrical component on the closed conduit, the heat exchanger is thermally connected to the closed conduit to draw heat out of the fluid to enhance the fluid flow.

16. The heat dissipating device of claim 12, wherein the electrical component is adapted to generate heat at less than or equal to 150° C.

17. The heat dissipating device of claim 12, wherein the volatile fluid evaporates due to the heat transferred to the fluid to create gas bubbles on the fluid to further increase fluid flow through the energy converter.

18. The heat dissipating device of claim 12, wherein the energy converter comprises a first electrode, a second electrode and a permanent magnet centrally displaced therebetween, the permanent magnet creating a magnetic field across the fluid whereby an electric potential is raised between the first electrode and the second electrode, each electrode deriving electricity across the electric potential.

19. The heat dissipating device of claim 12, wherein the fluid is a liquid metal.

20. The heat dissipating device of claim 12, wherein the heat exchanger is positioned on the fluid conduit to downwardably flow the fluid therethrough.

21. The heat dissipating device of claim 20, wherein the heat exchanger dissipates the heat across a plurality of heat fins into a heat reservoir.

22. A heat dissipating device for dissipating heat from an electrical component and for generating energy comprising:
    at least one electrical component which generates heat when in operation;
    at least one fluid conduit, the least one fluid conduit configured to channel a fluid therethrough, the at least one fluid conduit having a first column, a second column oppositely positioned from the first column, the at least one fluid conduit thermally connected to the at least one electrical component, each electrical component capable of generating heat at less than or equal to 150° C.;
    at least one energy converter, the at least one energy converter operatively associated with the at least one fluid conduit to generate electricity from the fluid flow, the at least one energy converter coupled to the at least one fluid conduit downstream from the electrical component, the at least one energy converter comprising a first electrode, a second electrode and a permanent magnet centrally displaced therebetween; and
    a heat exchanger, the heat exchanger operatively positioned on the second column, the heat exchanger thermally connected to the second column to transfer heat out of the fluid across heat fins into a heat reservoir.

23. The heat dissipating device of claim 22, further comprising a plurality of electrical leads coupled to the first electrode and the second electrode, the plurality of electrical leads transferring the electricity to an electrical storage.

24. The heat dissipating device of claim 22, wherein the permanent magnet is configured to create a magnetic field across the fluid whereby an electric potential is raised between the first electrode and the second electrode, each electrode deriving electricity across the electric potential.

25. The heat dissipating device of claim 22, wherein a volatile fluid is immersed in the fluid, the volatile fluid having a lower boiling point than the fluid.

26. The heat dissipating device of claim 25, wherein the volatile fluid heatably evaporates by the heat creating gas bubbles, the gas bubbles configured to enhance the fluid flow to increase the fluid flow through the energy converter.

27. The heat dissipating device of claim 26, wherein the gas bubbles have diameters less than half a smallest diameter of the fluid conduit.

28. A heat dissipating device for dissipating heat from an electrical component and for generating energy, comprising:
    an electrical component which generates heat when in operation;
    a fluid conduit configured to channel a fluid therethrough, the fluid conduit being thermally connected to the electrical component to cause the fluid to flow through the fluid conduit;
    a heat exchanger operatively positioned between the electrical component and the fluid conduit; and
    an energy converter operatively coupled to the fluid conduit that generates energy in response to the flow of fluid.

* * * * *